(12) United States Patent
Min

(10) Patent No.: US 12,696,579 B2
(45) Date of Patent: Jul. 28, 2026

(54) MICRO LED SELECTIVE AIR LAYER TRANSFER PRINTING DEVICE

(71) Applicant: HARDRAM CO., LTD., Ansan-si (KR)

(72) Inventor: Sung Wook Min, Incheon (KR)

(73) Assignee: HARDRAM CO., LTD., Ansan-si (KR)

( * ) Notice: Subject to any disclaimer, the term of this patent is extended or adjusted under 35 U.S.C. 154(b) by 508 days.

(21) Appl. No.: 18/273,890

(22) PCT Filed: Jan. 24, 2022

(86) PCT No.: PCT/KR2022/001245
§ 371 (c)(1),
(2) Date: Jul. 24, 2023

(87) PCT Pub. No.: WO2022/169164
PCT Pub. Date: Aug. 11, 2022

(65) Prior Publication Data
US 2024/0079516 A1 Mar. 7, 2024

(30) Foreign Application Priority Data

Feb. 4, 2021 (KR) ........................ 10-2021-0016333

(51) Int. Cl.
H10H 20/01 (2025.01)
H10P 72/76 (2026.01)
H10W 90/00 (2026.01)

(52) U.S. Cl.
CPC ......... H10H 20/01 (2025.01); H10P 72/7618 (2026.01); H10W 90/00 (2026.01)

(58) Field of Classification Search
CPC ................. H10H 20/01; H10H 20/018; H01L 21/68764; H01L 25/0753; B23K 26/06;
(Continued)

(56) References Cited

U.S. PATENT DOCUMENTS 10,564,548 B2 * 2/2020 Aoki ........................ G03F 7/707
2020/0020740 A1 * 1/2020 Kwag ..................... H01L 22/12
(Continued)

FOREIGN PATENT DOCUMENTS

JP H02-202031 A 8/1990
JP 2007-232648 A 9/2007
(Continued)

OTHER PUBLICATIONS

International Search Report for PCT/KR2022/001245 mailed May 9, 2022 from Korean Intellectual Property Office.
(Continued)

*Primary Examiner* — Ratisha Mehta
(74) *Attorney, Agent, or Firm* — Paratus Law Group, PLLC

(57) ABSTRACT

A micro LED selective air layer transfer print device, includes: a laser light source part which irradiates laser light; a wafer part which is located under the laser light source part to receive the laser light irradiated from the laser light source part; and a glass substrate part, which is located under the wafer part and onto which micro LED chips of the wafer part are transferred, wherein the glass substrate part includes: a substrate stage which is located under the wafer part; and a substrate lift part which lifts the whole substrate stage or only a portion of the substrate stage.

8 Claims, 7 Drawing Sheets

(58) Field of Classification Search
CPC . B23K 26/0648; H10P 72/7618; H10P 72/00;
H10P 72/70; H10P 72/76; H10P 72/0446;
H10W 90/00
See application file for complete search history.

(56) References Cited

U.S. PATENT DOCUMENTS

2020/0243358 A1* 7/2020 Kwag ............... H01L 21/67144
2020/0357779 A1* 11/2020 Kwag ................... H01L 25/167

FOREIGN PATENT DOCUMENTS

| KR | 10-2012-0069302 A | 6/2012 |
| KR | 10-2018-0115584 A | 10/2018 |
| KR | 10-2019-0057054 A | 5/2019 |
| KR | 10-2020-0094498 A | 8/2020 |
| KR | 10-2020-0107559 A | 9/2020 |

OTHER PUBLICATIONS

Korean Office Action for related KR Application No. 10-2021-0016333 mailed Jul. 7, 2022 from Korean Intellectual Property Office.

* cited by examiner ( a )

( b )

( c )

( a )

( b )

( a )

( b )

MICRO LED SELECTIVE AIR LAYER TRANSFER PRINTING DEVICE

CROSS-REFERENCE TO PRIOR APPLICATIONS

This application is a National Stage patent application of PCT International Patent Application No. PCT/KR2022/001245 (filed on Jan. 24, 2022) under 35 U.S.C. § 371, which claims priority to Korean Patent Application No. 10-2021-0016333 (filed on Feb. 4, 2021), which are all hereby incorporated by reference in their entirety.

BACKGROUND

The present invention relates to a micro LED selective air layer transfer printing device, and more specifically, to a micro LED selective air layer transfer printing device having a structure in which a wafer stage and a substrate stage can be moved accurately depending on a working state.

As the usage of indicating lamps in electronic devices, numerical panels in calculators, backlights in LED TVs, and various lighting fixtures has increased, the demand for light emitting diodes has also increased.

A light emitting diode is also referred to as an LED (Light Emitting Diode), which inject positive holes and electrons by applying a forward voltage (N-type as positive, P-type as negative) to a P-N junction diode, and emit energy produced by recombination of the positive holes and the electrons as light. The LED receives attention in the next-generation lighting application field due to high efficiency, long lifespan, and significant reduction in power consumption and maintenance costs.

In general, in order to manufacture an LED, III-V compound semiconductors such as gallium nitride (GaN), gallium phosphide (GaP), and gallium arsenide (GaAs) are used. The III-V compound semiconductors have excellent metallic stability and a direct transition type energy band structure, so have received much attention recently as a material for light emitting devices in the visible light and ultraviolet regions.

In the LEDs, which have been studied significantly as a global topic, the technology for developing microscale LED chips with a luminous area within the range of 100 μm×100 μm, not the conventional large-area lamp-type light emitting devices of cm2 scale.

However, due to the development of such small-sized micro LED chips, a transfer technology capable of transferring them as they are onto a substrate at the application stage in order to directly use the developed micro LED chips is being valued.

The most necessary technology for utilizing micro LED chips as cells of a light source is the technology to transfer the micro LED chips onto a transparent glass substrate using the micro LED chips as a display material.

Currently, in order to reliably and swiftly transfer the micro LED chips onto the transparent glass substrate, a technology that grows a micro LED structure on a wafer substrate, and transfers the LED structure to the glass substrate using air gap print technology is required.

Such a transfer technology must be conducted while maintaining a gap of less than 100 micrometers between the wafer substrate and the glass substrate, leading to a problem of defects due to mutual contact of the wafer substrate and the glass substrate by minor errors.

SUMMARY

Accordingly, the present invention has been made in view of the above-mentioned problems occurring in the related art, and it is an object of the present invention to provide a micro LED selective air layer transfer printing device, which includes a structure formed to minimize a change in a gap between a wafer substrate and a glass substrate occurring during the movement of the wafer substrate and a glass substrate in a transfer process of micro LED chips.

To accomplish the above-mentioned objects, according to the present invention, there is provided micro LED selective air layer transfer printing device including: a laser light source part which irradiates laser light; a wafer part which is located under the laser light source part to receive the laser light irradiated from the laser light source part; and a glass substrate part, which is located under the wafer part and onto which micro LED chips of the wafer part are transferred, wherein the glass substrate part includes: a substrate stage which is located under the wafer part; and a substrate lift part which lifts the whole substrate stage or only a portion of the substrate stage.

The laser light source part includes: a laser light source which generates laser light; a beam path part through which the laser light emitted from the laser light source passes; a mask part having a non-transmissive film which blocks a portion of the laser light passing through the beam path part and selectively allows only the portion of the laser light to pass; and a projection lens part which enlarges the magnification of the laser light transmitted through the mask part according to an area of the wafer.

The wafer unit includes: a wafer stage having a laser light transmission part formed at the center; a wafer vacuum-sucked under the wafer stage; and a micro LED chips formed on the lower surface of the wafer.

The glass substrate part further includes: a substrate lift support on which the substrate lift part is formed; a substrate left-right movement guide part which guides the substrate lift support to move left and right; a substrate left-right movement support on which the substrate left-right movement guide part is formed; and a substrate substrate front-rear movement part which guides the substrate left-right movement support to move forward and backward.

The substrate lift parts are formed in multiple, and each of the substrate lift parts includes: a first drive part; a first drive shaft for the first drive part; a drive slope member moving back and forth according to the rotation of the first drive shaft; a passive slope member which contacts the drive slope member and is lifted and lowered by the drive slope member; and a lift guide part formed to guide the lifting and lowering of the passive slope member.

The beam path part includes: an attenuator module, which is formed to adjust power while the laser light passes through; a beam forming part, which forms the shape of the laser light passed through the attenuator module to reduce a difference in energy intensity occurring depending on the position of the beam irradiation surface; and a field lens unit, which reduces distortion of the laser light passing through the beam forming part.

The wafer part includes: an additional lifting part which is formed under the periphery of a wafer center hole 820 of the wafer stage; a wafer suction part formed under the additional lifting part; and a distance measuring sensor installed on the wafer suction part.

The micro LED selective air layer transfer print device further includes a substrate rotation part, which is formed between the bottom of the substrate stage and the top of the substrate lift support to rotate the substrate stage.

The micro LED selective air layer transfer print device further includes a stage support member, which is formed on the substrate lift support to support the bottom of the substrate stage.

The drive slope member has a slope protrusion formed thereon, and the first passive slope member has a slope inlet recess into which the slope protrusion is introduced.

A lifting protrusion may be formed on the rear of the driven inclined member, and a lifting groove, into which the lifting protrusion is inserted, may be formed on the lifting guide part.

A lifting panel, which comes into contact with the bottom of the substrate stage, may be formed on the top of the driven inclined member.

The beam forming part may include a first homogenizing array part, a second homogenizing array part formed parallel to and spaced apart from the first homogenizing array part, and a condenser lens part formed parallel to and spaced apart from the second homogenizing array part.

The substrate rotation part includes: a cylindrical rotational center member formed in the center of the substrate lift support; a cylindrical rotation member formed around the cylindrical rotational center member; a substrate passive rotation member formed on one side of the substrate stage; and a substrate driving rotation member formed on one side of the top of the substrate lift support to rotate the substrate passive rotation member, wherein when the substrate passive rotation member moves by the substrate driving rotation member, the cylindrical rotation member rotates around the rotating central cylindrical member.

The stage support member includes: a stage support cylinder part; a first direction movement support part which is formed on the lower portion of the stage support cylinder part; and a second direction movement support part, which is formed to be movable in a direction perpendicular to the first direction movement support part on the lower part of the first direction movement support part In the present invention, a first elastic member, which is coupled to the lifting panel, can be further formed, and an auxiliary elastic member can be formed between the first elastic member and the substrate lifting support.

The substrate driving rotation member includes: a rotation drive part formed on one side of an upper portion of the substrate lift support by a motor or the like; a rotation drive shaft connected to the rotation drive part; a first direction movement member which is connected to the rotation drive shaft by spiral coupling, etc. and moves in a first direction according to the rotation of the rotation drive shaft; a first direction guide member which guides the movement of the first direction movement member; a second direction guide part formed on top of the first direction movement member; a second direction movement member formed to move in a second direction perpendicular to the first direction along the second direction guide part; and a cylindrical member inlet hole formed on the top of the second direction movement member into which the passive cylindrical member is introduced.

The present invention has the effect of providing a micro LED selective air layer transfer printing device in which a structure is formed that minimizes the change in the gap between the wafer and the glass substrate that occurs during the movement of the wafer and the glass substrate in a lift-off process of micro LED chips.

DETAILED DESCRIPTION

Hereinafter, advantages and features of the present disclosure and methods accomplishing the advantages and features will become apparent from the following detailed description of exemplary embodiments with reference to the accompanying drawings. However, the present invention is not limited to exemplary embodiment disclosed herein but will be implemented in various forms. The exemplary embodiments are provided so that the present invention is completely disclosed, and a person of ordinary skilled in the art can fully understand the scope of the present invention. Therefore, the present invention will be defined only by the scope of the appended claims. when it is determined that detailed descriptions of known functions or structures related with the present invention may make the essential points vague, the detailed descriptions of the known functions or structures will be omitted.

Figure 1:
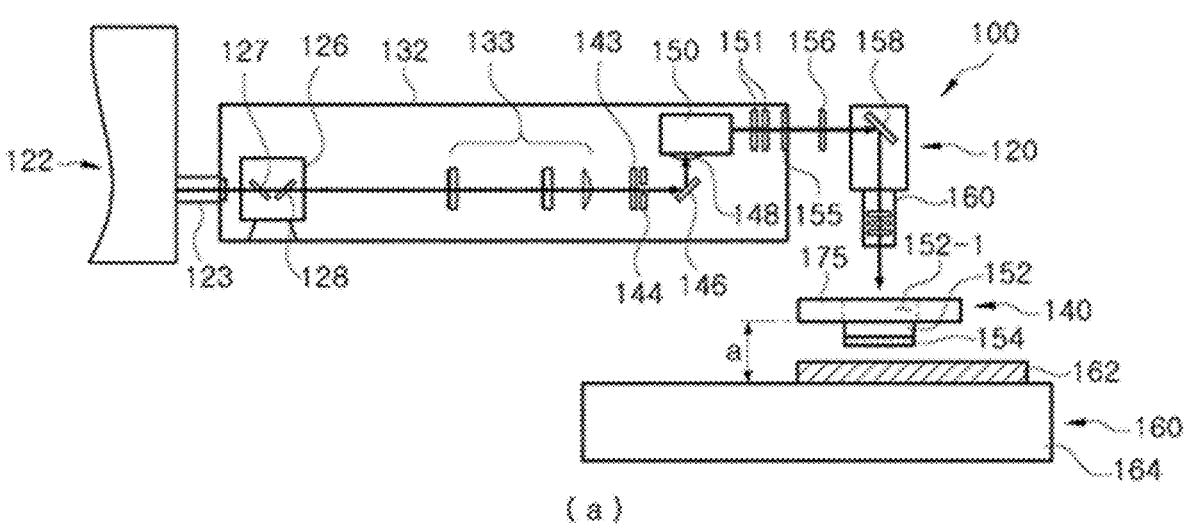
FIG. 1, (a) is a schematic side view illustrating essential parts of a micro LED selective air layer transfer printing device of the present invention, FIG. 1, (b) is a schematic model diagram of an optical system beam processing of the micro LED selective air layer transfer printing device of the present invention, and FIG. 1, (c) is a schematic model diagram representing a beam passing through the optical system of the micro LED selective air layer transfer printing device of the present invention.
Figure 1:
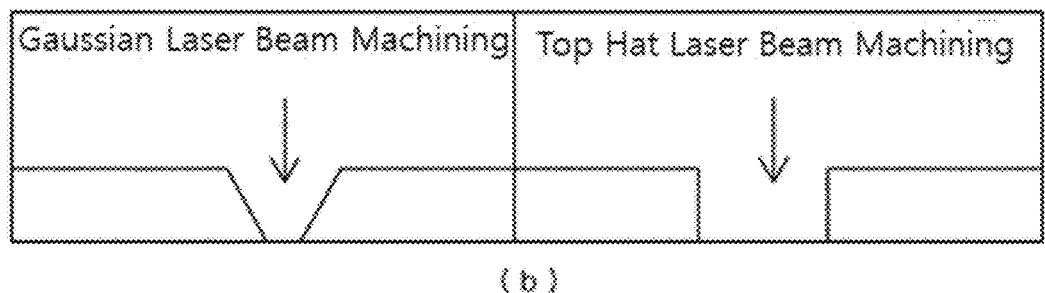
Figure 1:
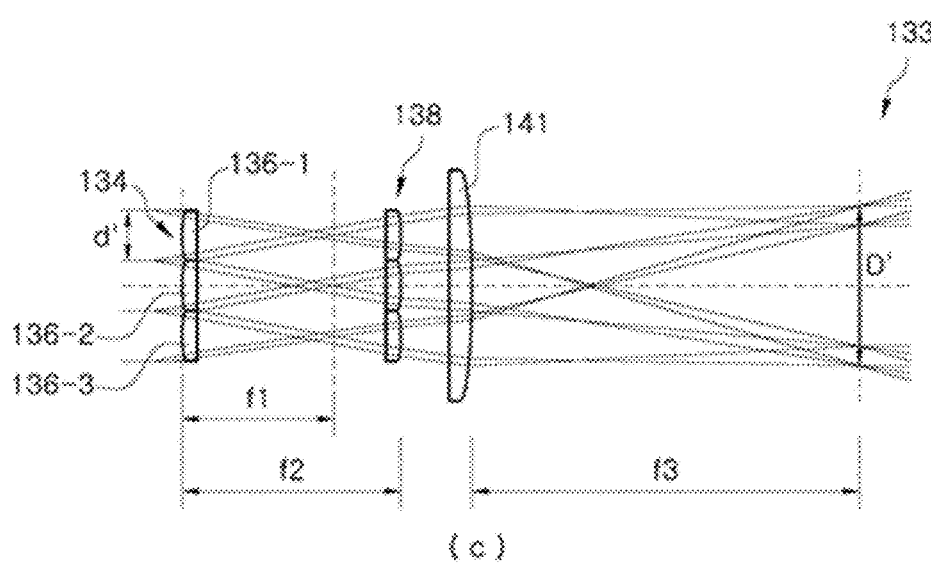
Figure 2:
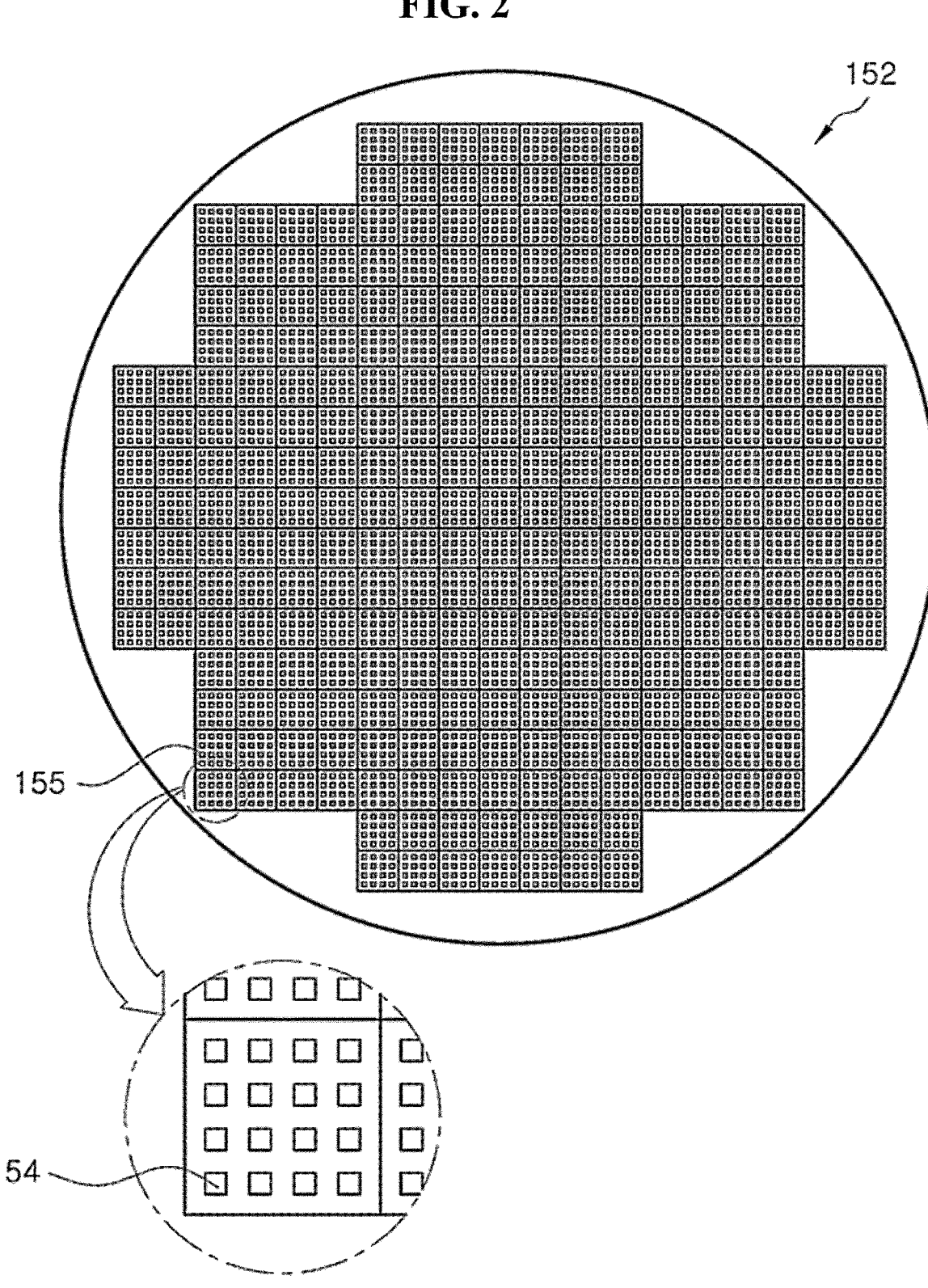
FIG. 2 is a schematic front view illustrating a wafer.

FIG. 1, (a) is a schematic side view illustrating essential parts of a micro LED selective air layer transfer printing device of the present invention, FIG. 1, (b) is a schematic model diagram of an optical system beam processing of the micro LED selective air layer transfer printing device of the present invention, FIG. 1, (c) is a schematic model diagram representing a beam passing through the optical system of the micro LED selective air layer transfer printing device of the present invention, and FIG. 2 is a schematic front view illustrating a wafer.

The micro LED selective air layer transfer printing device 100 of the present invention includes: a laser light source unit 120 which irradiates laser light, a wafer unit 140 which is located under the laser light source unit 120 to receive the laser light irradiated from the laser light source unit 120; and a glass substrate unit 160 which is located under the wafer unit 140 and onto which micro LED chips 154 from the wafer unit 140 are transferred.

The laser light source unit 120 includes: a laser light source 122 which generates laser light, a beam path part 132 through which the laser light emitted from the laser light source 122 passes, a customer's mask unit 156 having a non-transmissive layer that partially blocks the laser light passed through the beam path part 132 and selectively lets only a portion of laser light pass through; and a projection lens unit 161 which enlarges the scale of the laser light transmitted through the customer's mask unit 156 according to an area of the wafer 152.

the laser light generated from the laser light source 122 may use various types of lasers, such as an excimer laser, a DPSS laser, and the like, depending on bandgap energy. In this embodiment, a laser irradiation module may use an excimer laser which has a wavelength of 157 nm to 350 nm. Furthermore, it is preferable that the wavelength of the laser light output from the laser irradiation module falls within the ultraviolet wavelength range.

The laser light source unit 120 further includes an entrance window (EW) unit 123 formed between the laser light source 122 and the beam path part 132, and the entrance window unit 123 is made of transparent glass that only transmits ultraviolet (UV) light.

The beam path part 132 includes: an attenuator module 126 formed to adjust power while the laser light passed through the entrance window unit 123 passes through; a beam shaping unit 133 which changes the beam shape of the laser light passed through the attenuator module 126 from a Gaussian shape to a top hat shape; a first field lens unit 143 which minimizes distortion of the laser light passed through the beam shaping unit 133; a slit mask unit 144 which blocks a portion of the laser light passed through the first field lens unit 143; a first mirror 146 which moves the laser light passed through the slit mask unit 144 vertically upwards; a second condenser lens unit 148 which collects the laser light reflected from the first mirror 146; a scanner unit 150 which controls the laser light passed through the second condenser lens unit 148; a second field lens unit 151 which minimizes distortion of the laser light passed through the scanner unit 150; and an exit window unit 155 formed at an exit where the laser light passed through the second field lens unit 151 goes out of the beam path part 132.

The attenuator module 126 includes an attenuator substrate 127 and a compensator substrate 128.

The attenuator substrate 127 functions to reduce the intensity of the laser light without distortion of the waveform, and the compensator substrate 128 functions to maintain the waveform of the laser light that has passed through the attenuator substrate 127.

The beam shaping unit 133 includes a first homogenizer array unit 134, a second homogenizer array unit 138 which is formed parallel to and at a certain distance from the first homogenizer array unit 134, and a first condenser lens unit 141 which is formed adjacent to and parallel with the second homogenizer array unit 138.

The first homogenizer array unit 134 and the second homogenizer array unit 138 respectively include a plurality of micro-lenses.

If a focal distance of one 136-1 of the plurality of first micro-lenses 136-1, 136-2, and 136-3 of the first homogenizer array unit 134 is defined as f1, a distance between the first homogenizer array unit 134 and the second homogenizer array unit 138 is defined as f2, a focal distance of the first condenser lens unit 141 is defined as f3, a diameter of the first micro-lens 136-1 is defined as d', and a diameter of the laser light formed at the focal distance of the first condenser lens unit 141 is defined as D', the following mathematical equation is established:

$$D' = d'^{*}(f3/f2).$$  (Mathematical Equation)

The laser light is formed into a top hat laser beam shape from a Gaussian laser beam shape while passing through the first homogenizer array unit 134, the second homogenizer array unit 138, and the first condenser lens unit 141.

The Gaussian laser beam shape refers to a case in which there is a difference in energy intensity depending on the position of the beam irradiation surface, and the top hat laser beam shape is a beam shape to minimize the difference in energy intensity occurring depending on the position of the beam irradiation surface.

The customer's mask unit 156 is formed adjacent to the exit window unit 155 of the beam path part 132, and blocks a portion of the laser light passing through the exit window unit 155 and allowing only the remainder to pass through.

The second mirror 158 is formed adjacent to the customer's mask unit 156 to move the laser light passing through the customer's mask unit 156 vertically downwards, and the laser light reflected from the second mirror 158 passes through the projection lens unit 161 so as to be adjusted in size.

The wafer unit 140 includes: a wafer stage 175 having a laser light transmission part 152-1 formed at the center; a wafer 152 vacuum-sucked under the wafer stage 175; and a micro LED chips 154 formed on the lower surface of the wafer 152.

The micro LED chips 154 are arranged on the wafer 152 in a block unit, and one block 155 is composed of micro LED chips 154 in horizontal number×vertical number.

In addition, the wafer 152 may include an R-wafer, a G-wafer, and a B-wafer, and in this invention, the R-wafer is shown through FIG. 2. The R-wafer has multiple micro Red-LED chips, the G-wafer has multiple micro Green-LED chips, and the B-wafer has multiple micro Blue-LED chips.

The glass substrate unit 160 includes a glass substrate 162, which is formed at a distance below the micro LED chips 154, and a substrate stage 164, onto which the glass substrate 162 is vacuum-sucked.

A gap (a) between the lower surface of the wafer stage 175 and the upper surface of the substrate stage 164 is a very narrow distance of less than 100 micrometers.

The process of dropping the micro LED chips 154 formed on the wafer 152 onto the glass substrate 162 by the laser emitted from the laser light source 122 is referred to as transfer (lift-off).

The laser light source unit 120 is fixed, and the laser that passed through the projection lens unit 161 irradiates only a portion of the multiple micro LED chips 154 formed on the lower surface of the wafer 152.

Therefore, for lift-off of the entirety of the multiple micro LED chips 154 formed on the lower surface of the wafer 152, a micro LED chip lift-off process of transferring some of the multiple micro LED chips 154, simultaneously moving the wafer stage 175 and the substrate stage 164 by the distance of a next lift-off region, and irradiating the laser is repeated until all of the multiple micro LED chips 154 are transferred (lift-off).

The lift-off process will be described in more detail below.

Figure 3:
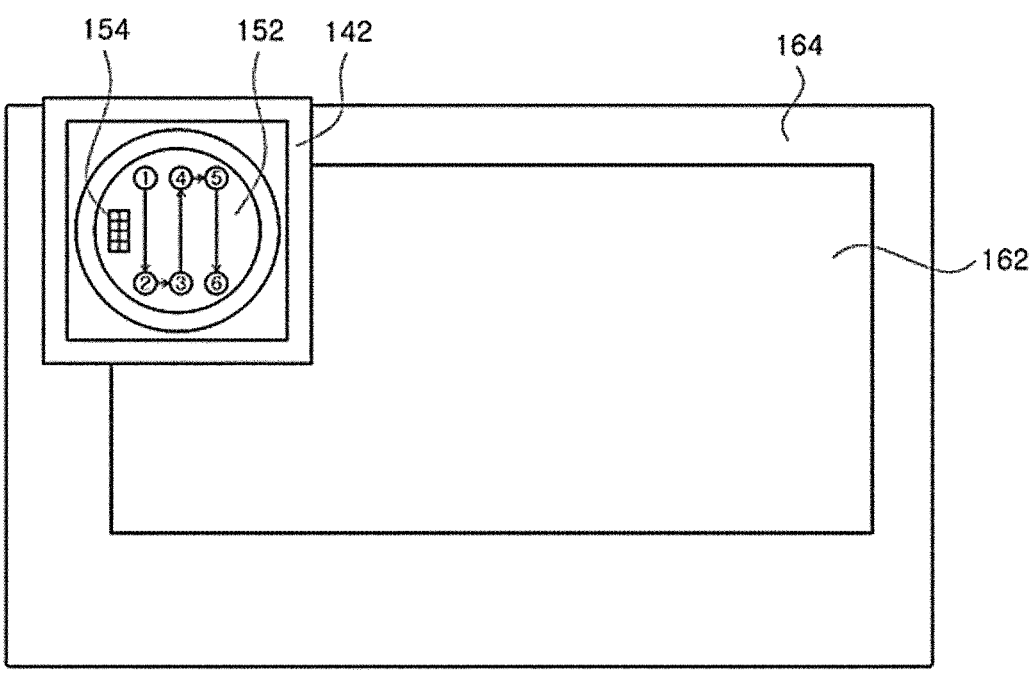
FIG. 3 is a first conceptual diagram illustrating a lift-off process of micro LED chips.
Figure 4:
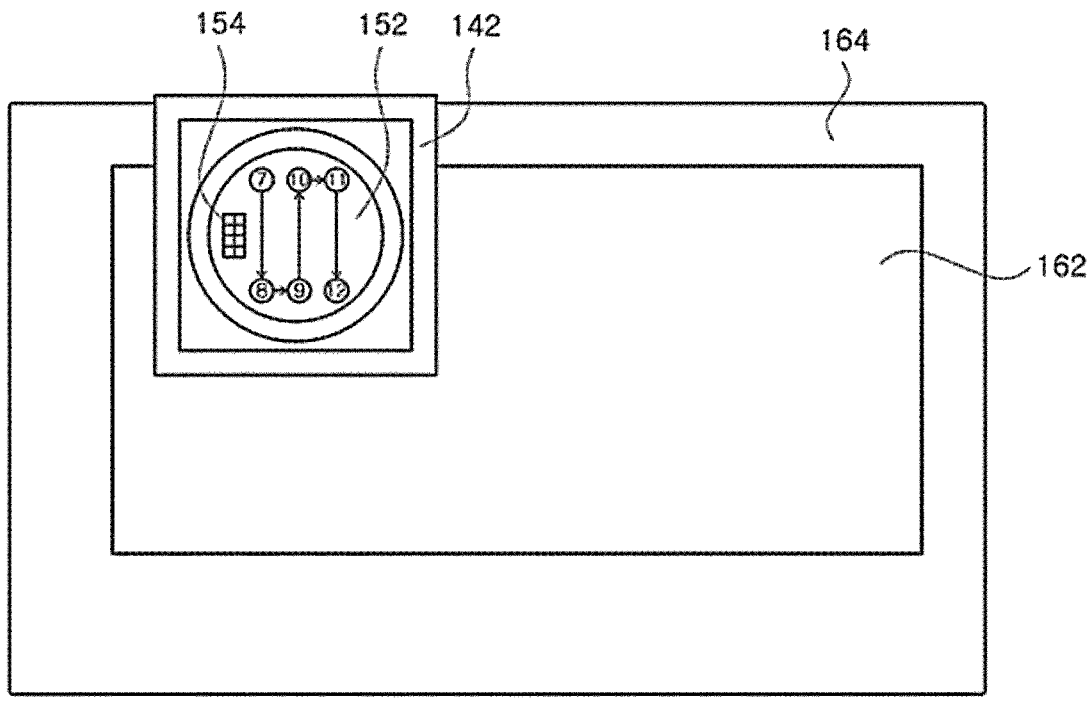
FIG. 4 is a second conceptual diagram illustrating a lift-off process of micro LED chips.

FIG. 3 is a first conceptual diagram showing the lift-off process of the micro LED chips, and FIG. 4 is a second conceptual diagram showing the lift-off process of the micro LED chips.

The arrows in FIG. 3 are indicated according to the sequence in which the laser light is irradiated, and in fact, the laser light is irradiated on the same position from a fixed state, and the wafer stage 175 and the substrate stage 164 move in the direction opposite to the arrow direction to perform lift-off.

That is, the lift-off of the micro LED chips 154 formed on the wafer 152 is performed in a first area 1 of the wafer 152 as illustrated in FIG. 3, and the laser light is fixed at the position of the first area 1, and a second area 2 moves to the position of the first area 1 while the wafer stage 175 and the substrate stage 164 move simultaneously, and then the lift-off is performed. Thereafter, the wafer stage 175 and the substrate stage 164 move simultaneously and a third area 3 moves to the original position of the first area 1 where the laser light is irradiated, so lift-off is performed. Such a process is performed in a fourth area 4, a fifth area 5 and a sixth area 6 in the same way.

At this time, all the micro LED chips 154 formed on the wafer 152 are one of three types of chips, red, green, blue, so not all the chips in one area are transferred to the glass substrate 162 at once, but only the chips located at regular intervals in one area are transferred due to the operation of the customer's mask unit 156.

When the lift-off is completed up to the sixth area 6, the wafer stage 175 moves from the position in FIG. 3 to the position in FIG. 4 while the substrate stage 164 is fixed.

Thereafter, similar to the lift-off process depicted in FIG. 3, in FIG. 4, while the wafer stage 175 and the substrate stage 164 move at the same time, a seventh area 7 is moved to the original position of the first area 1 to progress the lift-off through the laser light, and then the wafer stage 175 and the substrate stage 164 move at the same time, and an eighth area 8 moves to the original position of the first area 1 to progress the lift-off through the laser light. The above process is continued through a ninth area 9, a tenth area 10, an eleventh area 11 and a twelfth area 12.

During the lift-off process, a distance between the lower surface of the wafer stage 175 and the upper surface of the substrate stage 164 is less than 100 micrometers, which is very narrow, so the gap between the micro-LED chip 154 located at the bottom of the wafer stage 175 and the upper surface of the glass substrate 162 is even narrower, and it is necessary to prevent defects caused by the micro-LED chip 154 and the glass substrate 162 coming into contact with each other through the process of moving while maintaining the narrow gap.

Figure 5:
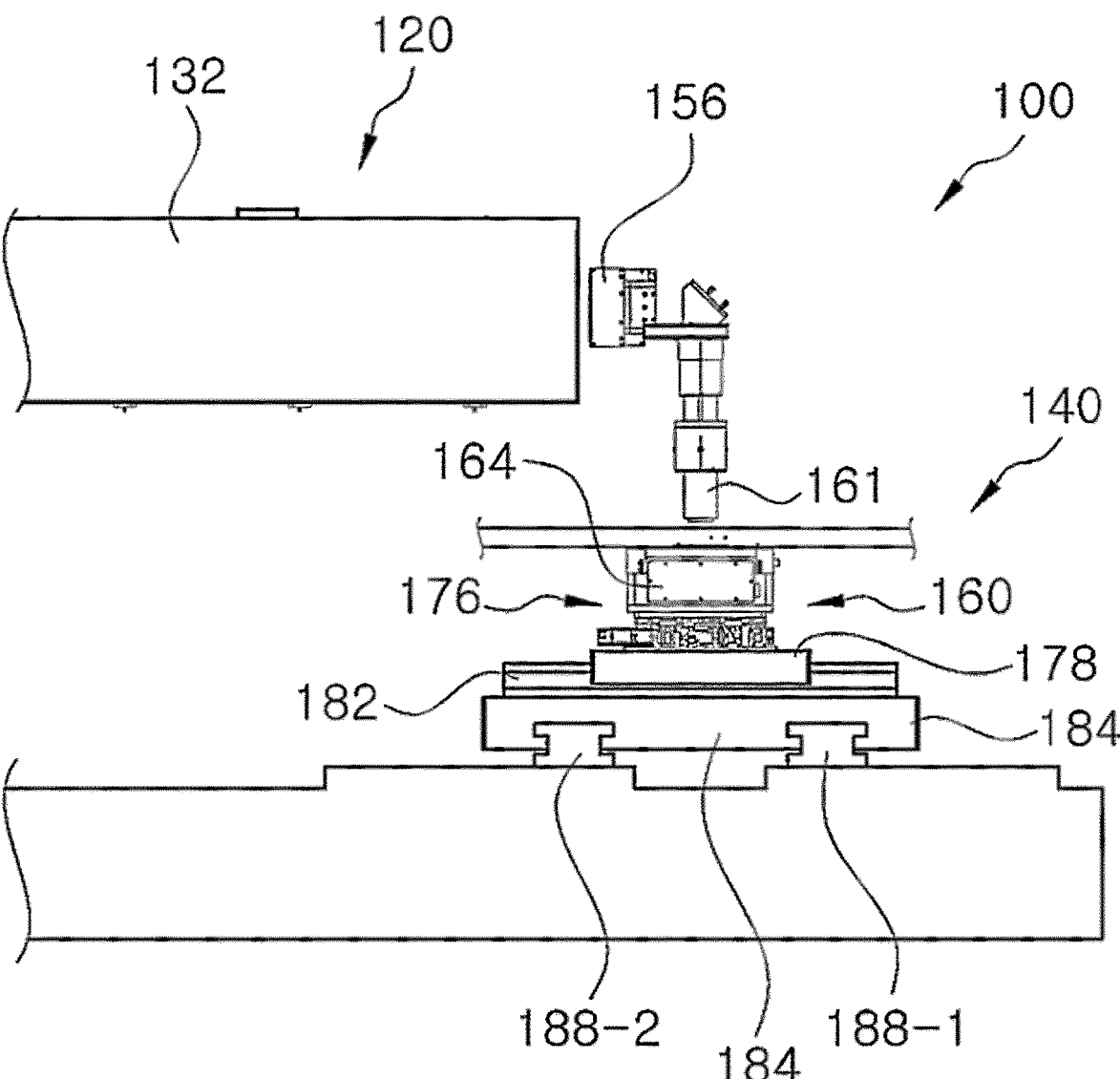
FIG. 5 is a schematic front view illustrating essential parts of a micro LED selective air layer transfer printing device of the present invention.
Figure 6:
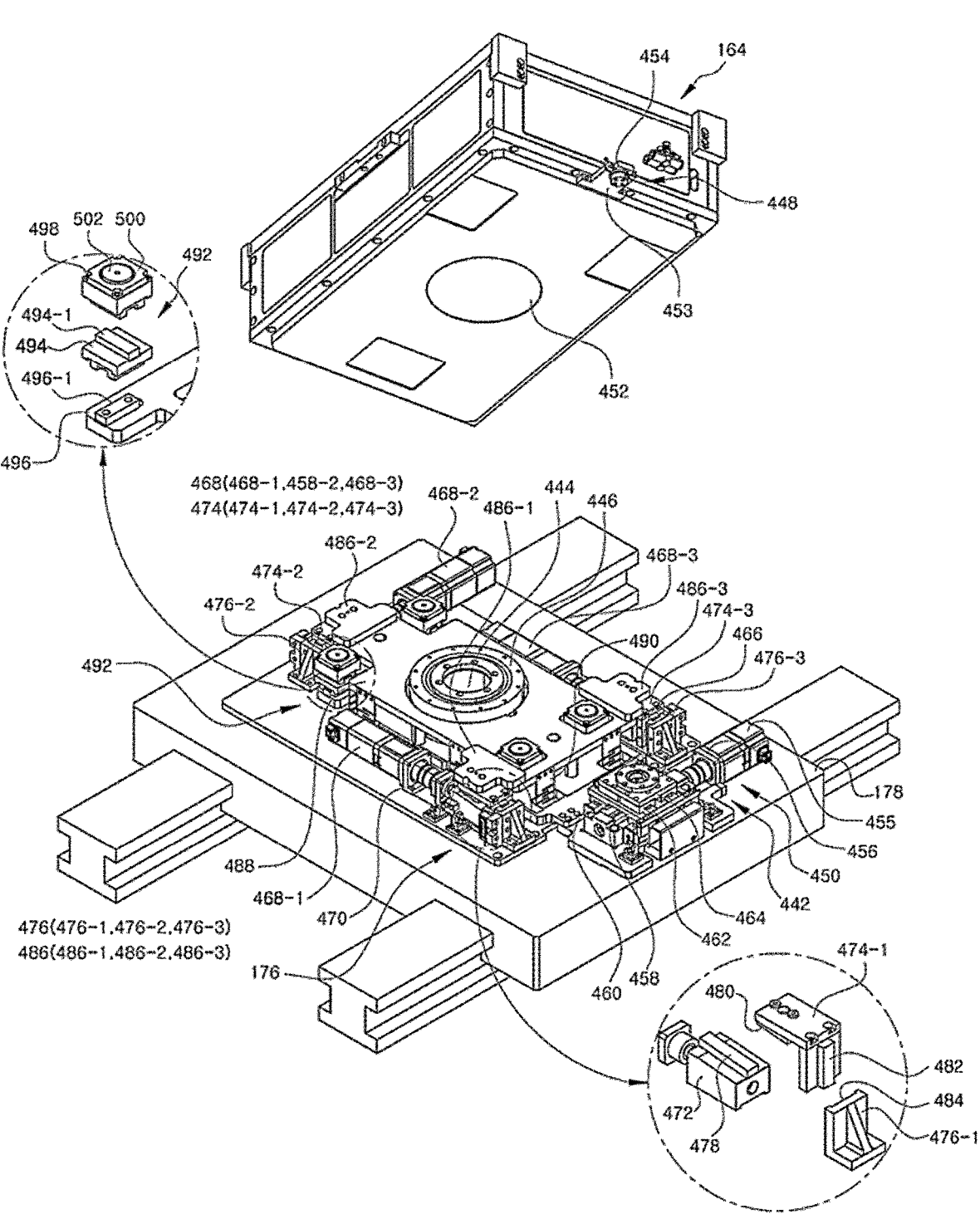
FIG. 6 is a schematically exploded perspective view in which a substrate stage and a substrate lifting support are separated.

FIG. 5 is a schematic front view illustrating essential parts of a micro LED selective air layer transfer printing device of the present invention, and FIG. 6 is a schematically exploded perspective view in which a substrate stage and a substrate lifting support are separated.

The micro-LED selective air layer transfer printing apparatus 100 of the present invention includes a support 166 on which the laser light source part 120, the wafer part 140, and the glass substrate part 160 are formed.

The customer mask part 156 and the projection lens part 161 are connected to the beam path part 132, and the projection lens part 161 is located above the support 166 to be spaced apart from the support 166.

The glass substrate part 160 includes: a substrate lift part 176 which lifts the substrate stage 164; a substrate lift support 178 on which the substrate lift part 176 is formed; a substrate left-right movement guide part 182 which guides the substrate lift support 178 to move left and right, a substrate left-right movement support 184 on which the substrate left-right movement guide part 182 is formed, and two substrate front-rear movement parts 188-1 and 188-2 which guide the substrate left-right movement support 184 to move front and back.

The two substrate front-rear movement parts 188-1 and 188-2 are located on top of the support 166.

In the present invention, a substrate rotation part 442 is formed adjacent to the substrate lift part 176 between the bottom of the substrate stage 164 and the top of the substrate lift support 178.

The substrate rotation part 442 includes: a cylindrical rotational center member 444 formed in the center of the substrate lift support 178; a cylindrical rotation member 446 formed around the cylindrical rotational center member 444; a substrate passive rotation member 448 formed on one side of the substrate stage 164; and a substrate driving rotation member 450 formed on one side of the top of the substrate lift support 178 to rotate the substrate passive rotation member 448.

The cylindrical rotation member 446 is connected to the cylindrical rotational center member 444 by bearings, etc. to be rotated around the cylindrical rotational center member 444, and the top of the cylindrical rotation member 446 is coupled to the substrate stage 164 by contacting a circular groove 452 formed in the center of the bottom surface of the substrate stage 164.

The substrate passive rotation member 448 includes: a passive bracket part 453 formed on one side of the substrate stage 164; and a passive cylindrical member 454 connected to the passive bracket part 453.

The substrate driving rotation member 450 includes: a rotation drive part 455 formed on one side of an upper portion of the substrate lift support 178 by a motor or the like; a rotation drive shaft 456 connected to the rotation drive part 455; a first direction movement member 458 which is connected to the rotation drive shaft 456 by spiral coupling, etc. and moves in a first direction according to the rotation of the rotation drive shaft 456; a first direction guide member 460 which guides the movement of the first direction movement member 458; a second direction guide part 462 formed on top of the first direction movement member 458; a second direction movement member 464 formed to move in a second direction perpendicular to the first direction along the second direction guide part 462; and a cylindrical member inlet hole 466 formed on the top of the second direction movement member 464 into which the passive cylindrical member 454 is introduced.

When the substrate driving rotation member 450 operates, the rotation drive shaft 456 rotates to move the first direction movement member 458 and the second direction movement member 464 and rotate the passive cylindrical member 454, and as a result, the cylindrical rotation member 446 also rotates around the cylindrical rotational center member 444, and the substrate stage 164 is also rotated at the same time.

In the lift-off process using the laser beam, an angle at which the substrate stage 164 is generally rotated is very slight, so the range in which the rotation drive part 455 operates is not large, but it operates within a predetermined range necessary for precise lift-off.

The plurality of substrate lifting parts 176 formed in the same shape at three points of the substrate lifting support 178 include: first drive parts 468 (468-1, 468-2, and 468-3); a first drive shaft 470 for the first drive parts 468 (468-1, 468-2, and 468-3); a first drive slope member 472 which is coupled to the first drive shaft 470 by spiral coupling, etc. and moves back and forth according to the rotation of the first drive shaft 470; first passive slope members 474 (474-1, 474-2, and 474-3) which contact the first drive slope member 472 and are lifted and lowered by the first drive slope member 472; and first lift guide parts 476 (476-1, 476-2, and 476-3) which are formed to guide the lifting and lowering of the first passive slope member 474 (474-1, 474-2, and 474-3).

The first drive slope member 472 has a slope protrusion 478 formed thereon, and each of the first passive slope members 474 (474-1, 474-2, and 474-3) has a slope inlet recess 480 formed thereon, into which the slope protrusion 478 is introduced, so the slope protrusion 478 moves along the slope inlet recess 480, causing the first passive slope member 474 (474-1, 474-2, and 474-3) to ascend and descend.

A lifting protrusion 482 is formed on the rear surface of the first passive slope member 474 (474-1, 474-2, and 474-3), and a lifting recess 484 into which the lifting protrusion 482 is introduced is formed on the first lifting guide part 476 (476-1, 476-2, and 476-3), so the first passive slope member 474 (474-1, 474-2, and 474-3) is connected to the first lifting guide part 476 (476-1, 476-2, and 476-3) to ascend and descend stably in a state in which the lifting protrusion 482 is introduced into the lifting recess 484.

First lifting panels 486 (486-1, 486-2, and 486-3) which contact the bottom of the substrate stage 164 are formed on the top of the first passive slope members 474 (474-1, 474-2, and 474-3).

In the present invention, a first elastic member 488, formed by a single leaf spring commonly connected to the three first lifting panels 486 (486-1, 486-2, and 486-3), is formed, and between the first elastic member 488 and the upper surface of the substrate lift support 178, a plurality of auxiliary elastic members 490 are formed in a bent elastic form.

When the three first drive parts 468 (468-1, 468-2, and 468-3) all operate in one direction, the three first passive slope members 474 (474-1, 474-2, and 474-3) ascend, and the substrate stage 164 and the first elastic member 488 also ascend.

When the three first drive parts 468 (468-1, 468-2, and 468-3) all operate in the other direction, the three first passive slope members 474 (474-1, 474-2, and 474-3) descend, and the substrate stage 164 and the first elastic member 488 also descend.

When only the first drive part 468-1 of the three first drive parts 468 (468-1, 468-2, and 468-3) operates in one direction, only the first passive slope member 474-1 of the three first passive slope members 474 (474-1, 474-2, and 474-3) rises, and only a portion of the substrate stage 164, on which the first passive slope member 474-1 is located, ascends, and only a portion of the first elastic member 488, on which the first passive slope member 474-1 is located, is elastically deformed. As a result, only a portion of the substrate stage 164 increases in height, achieving fine adjustment.

In this state, when only the first drive part 468-1 among the three first drive parts 468 (468-1, 468-2, and 468-3) operates in the other direction, only the first passive inclined member 474-1 among the three first passive inclined members 474 (474-1, 474-2, and 474-3) descends, so, only a portion of the substrate stage 164, on which the first passive inclined member 474-1 is located, descends, and only a portion of the first elastic member 488, on which the first passive inclined member 474-1 is located, exerts a restoring elastic force. The auxiliary elastic member 490 enhances the restorative elastic force of the first elastic member 488, thereby acting to rapidly return to the original position.

Stage support members 492 which support the lower portion of the substrate stage 164 are formed at four points of the upper surface of the substrate lift support 178.

The stage support member 492 includes: a stage support cylinder part 500; a first direction movement support part 494 which is formed on the lower portion of the stage support cylinder part 500; and a second direction movement support part 496, which is formed to be movable in a direction perpendicular to the first direction movement support part 494 on the lower part of the first direction movement support part 494.

A first cylindrical rotating member (494-1) is formed between the lower part of the stage support cylinder part 500 and the upper part of the first direction movement support part 494, so the stage support cylinder part 500 minutely moves in the first direction from the upper portion of the first direction movement support part 494.

A second cylindrical rotating member (496-1) is formed between the lower part of the first direction movement support part 494 and the upper part of the second direction movement support part 496, so the first direction movement support part 494 minutely moves in the second direction from the upper part of the second direction movement support part 496.

In the state where the stage support member 492 supports the lower portion of the substrate stage 164, when the substrate stage 164 is rotated by the substrate rotating part 442, the stage support member 492 also minutely moves in the first or second direction, thereby supporting the substrate stage 164 without interfering with the rotation of the substrate stage 164.

Additionally, the stage support member 492 includes: a stage support sensor part 498, which is formed around the circumference of the stage support cylinder part 500, and formed by ultrasonic waves to measure a distance; and a stage support lifting part 502, which is lifted by the stage support cylinder part 500.

When the substrate lifting part 176 operates such that the three first drive parts 468 (468-1, 468-2, and 468-3) operate and the substrate stage 164 ascends entirely, the stage support member 492 detects a separation distance between the substrate stage 164 and the stage support sensor part 498, so the stage support cylinder part 500 is operated and the stage support lift part (502) ascends until contacting the bottom of the substrate stage 164.

If only one of the three first drive parts 468 (468-1, 468-2, and 468-3) is operated, only a portion of the stage support lift part (502), which is separated from the substrate stage 164, is operated.

As described above, the present invention can accurately control the substrate stage 164 through the rise and fall of the substrate stage 164 and the tilting structure of the substrate stage 164.

Figure 7:
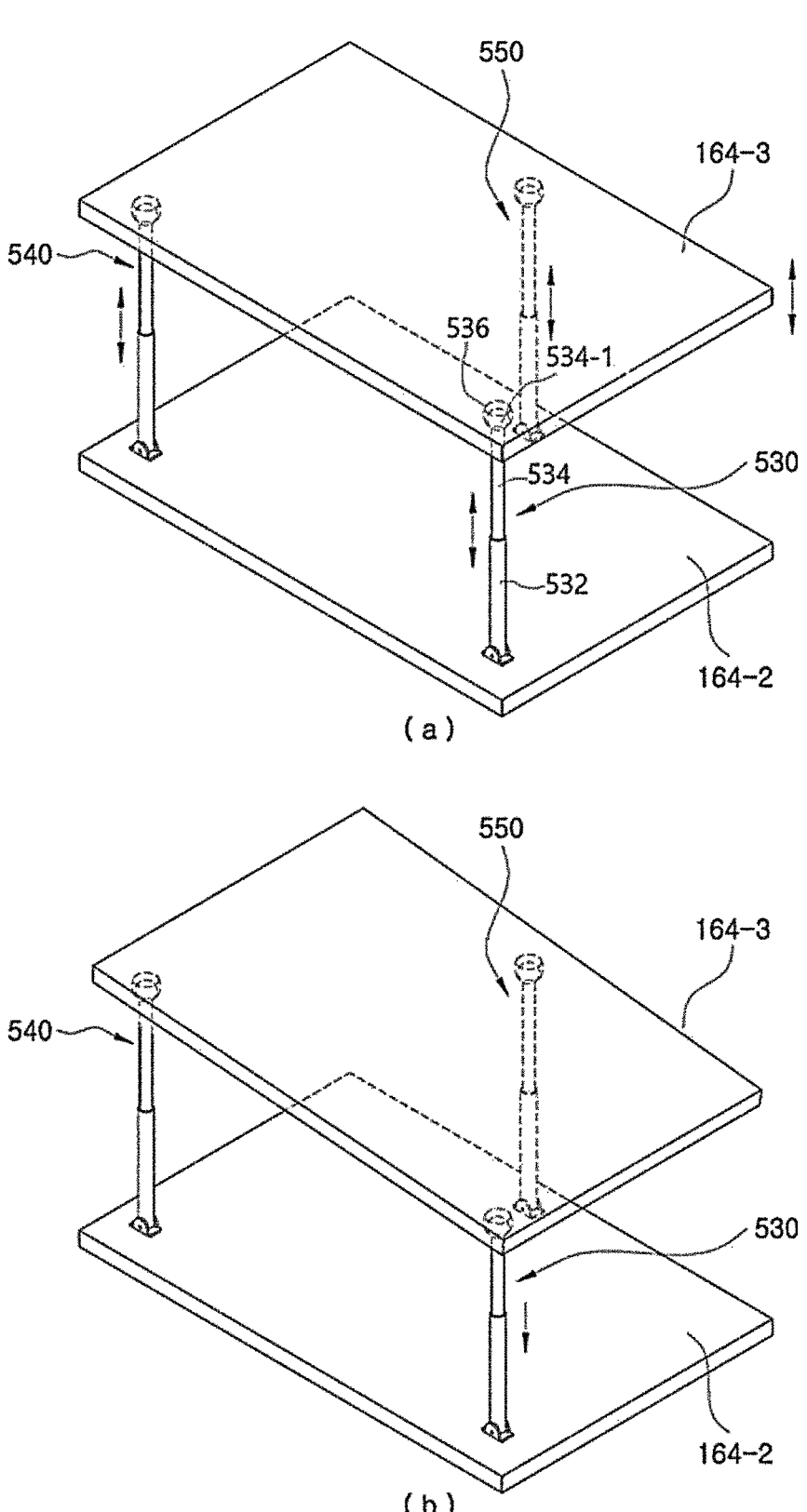
FIG. 7, (a) is a schematically perspective view illustrating a case in which the substrate stage is lifted by a transformation driving part, and FIG. 7, (b) is a schematically perspective view illustrating a case in which the substrate stage is inclined by the transformation driving part.

FIG. 7, (a) is a schematically perspective view illustrating a case in which the substrate stage is lifted by a transformation driving part, and FIG. 7, (b) is a schematically perspective view illustrating a case in which the substrate stage is inclined by the transformation driving part.

The structure in which the substrate stage 164 entirely rises and falls, or only one side rises and falls above the substrate lift support 178 can also be realized by deformation driving parts 530, 540, and 550.

That is, as illustrated in FIG. 7, the deformation driving parts 530, 540, and 550 can be formed at three points between the lower portion of the deformation substrate stage 164-3 and the upper portion of the deformation substrate lift support 164-2.

Each of the deformation driving parts 530, 540, and 550 includes: a ball housing part 536 which has a hollow spherical space formed in the lower surface of the deformation substrate stage 164-3; a cylinder part 534 which has a ball 534-1 introduced into the ball housing part 536; and a hinge member 532 formed on the lower portion of the cylinder part 534.

The cylinder part 534 is expandable, and the ball 534-1 can rotate inside the ball housing part 536.

The hinge member 532 is fixed to the upper surface of the deformation substrate lift support 164-2.

As illustrated in FIG. 7, (a), the deformation driving parts 530, 540, and 550 are formed at three points, and when all three deformation driving parts 530, 540, and 550 ascend and descend in the same size, the deformation substrate stage 164-3 ascends and descends vertically relative to the deformation substrate lift support 164-2.

Moreover, as illustrated in FIG. 7, (b), when only the first deformation driving part 530 among the deformation driving parts 530, 540, and 550 descends, the deformation substrate stage 164-3 tilts downwards at the point where the first deformation driving part (530) is located.

Through the configuration as described above, the deformation substrate stage 164-3 is capable of rising and falling, and tilting.

Figure 8:
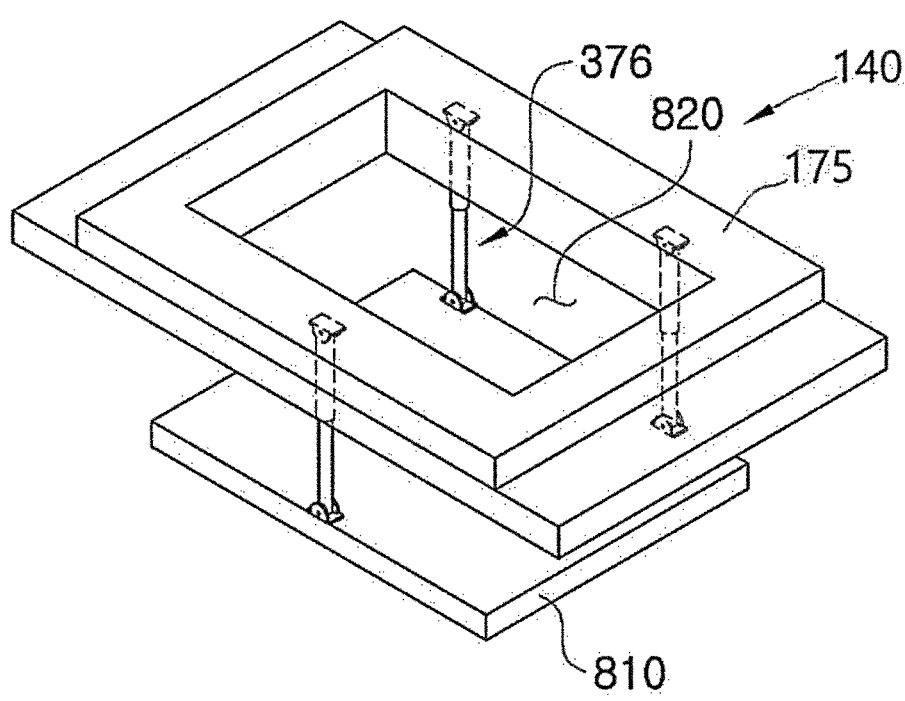
FIG. 8, (a) is a schematic perspective view of a wafer front and rear moving passive member, and FIG. 8, (b) is a schematic front view of the wafer front and rear moving passive member.
Figure 8:
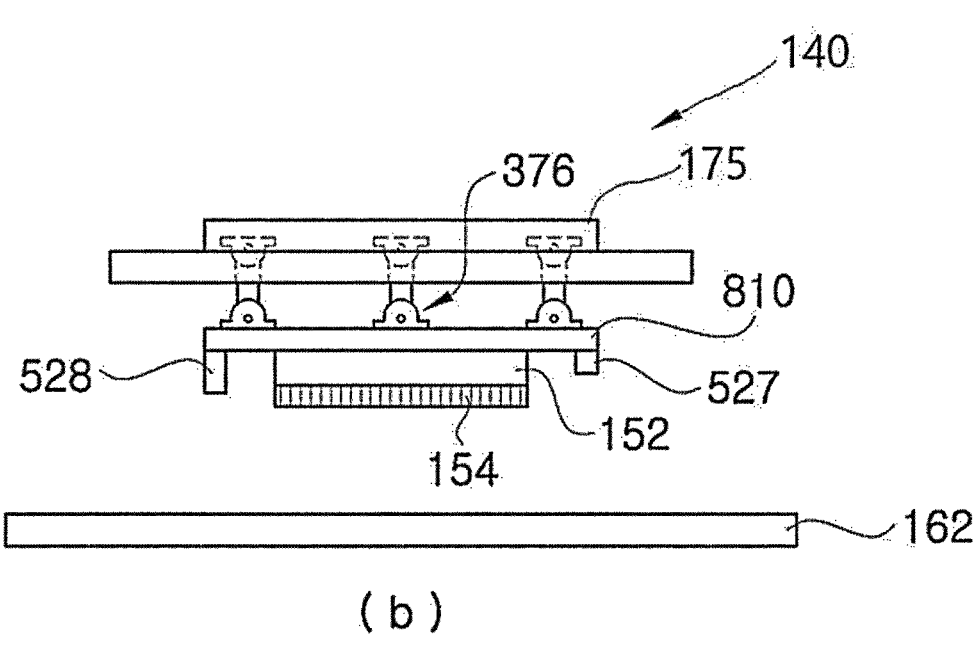

FIG. 8, (a) is a schematic perspective view of a wafer front and rear moving passive member, and FIG. 8, (b) is a schematic front view of the wafer front and rear moving passive member.

The wafer part 140 includes: an additional lifting part 376 which is formed under the periphery of a wafer center hole 820 of the wafer stage 175; a wafer suction part 810 formed under the additional lifting part 376; and a first distance measuring sensor 527 and a second distance measuring sensor 528 which are installed on the lower surface of the wafer suction part 810 which use ultrasound.

The wafer 152 is pressed onto the wafer suction part 810, and the micro LED chips 154 are formed on the lower surface of the wafer 152.

The additional lifting parts 376 are formed at three points between the wafer stage 175 and the wafer suction part 810, and have the shape similar to that of the deformation driving parts 530, 540, and 550, so detailed description thereof is omitted.

The first distance measuring sensor 527 and the second distance measuring sensor 528 emit ultrasound towards the glass substrate 162 located below, in a state in which they are separated to face each other based on the wafer 152, and measure the arrival time of the reflected ultrasound to measure whether the gap between the wafer suction part 810 and the glass substrate 162 is uniform.

The present invention can provide the micro LED selective air layer transfer print device 100 having the structure that minimizes changes in the gap between the wafer 152 and the glass substrate 162 occurring during the movement of the wafer 152 and the glass substrate 162 during the micro LED chip lift-off process, since being able to determine whether the gap between the wafer suction part 810 and the glass substrate 162 is maintained uniformly through the first distance measuring sensor 527 and the second distance measuring sensor 528.

The embodiments described in the present invention are presented as the most desirable examples to assist in understanding by those skilled in the art, and the technical idea of the present invention is not defined or limited by the embodiments, and various changes and modifications, and equivalents of other embodiments, are possible within the scope without departing from the technical idea of this invention.

EXPLANATION OF SYMBOLS

100: Micro LED selective air layer transfer print device
    120: Laser light source part
122: Laser light source 132: Beam path part
140: Wafer part 154: Micro LED chip
156: Customer mask part 160: Glass substrate part
164: Substrate stage 175: Wafer stage
176: Substrate lift part 442: Substrate rotation part
444: Cylindrical rotational center member 446: Cylindrical rotation member
450: Substrate driving rotation member 454: Passive cylindrical member
458: First direction moving member 464: Second direction moving member
470: First drive shaft 472: First drive slope member

The invention claimed is:

1. A micro LED selective air layer transfer print device comprising:
   a laser light source part comprising an excimer laser configured to emit laser light having a wavelength of 157 nm to 350 nm;
   a wafer part which is located under the laser light source part to receive the laser light irradiated from the laser light source part; and
   a glass substrate part, which is located under the wafer part and onto which micro LED chips of the wafer part are transferred,
   wherein the glass substrate part includes:
   a substrate stage which is located under the wafer part; and
   a substrate lift part which lifts the whole substrate stage or only a portion of the substrate stage,
   wherein the laser light source part comprises:
      an attenuator module, which is formed to adjust power while the laser light passes through;
      a beam forming part, which forms a shape of the laser light passed through the attenuator module to reduce a difference in energy intensity occurring depending on a position of a beam irradiation surface; and
      a field lens unit, which reduces distortion of the laser light passing through the beam forming part,
   wherein the beam forming part is configured to shape the laser light into a top hat laser beam shape.

2. The micro LED selective air layer transfer print device according to claim 1, wherein the laser light source part further comprises:
   a laser light source which generates the laser light;
   a beam path part through which the laser light emitted from the laser light source passes;
   a mask part having a non-transmissive film which blocks a portion of the laser light passing through the beam path part and selectively allows only a portion of the laser light to pass; and
   a projection lens part which enlarges a scale of the laser light transmitted through the mask part according to an area of the wafer.

3. The micro LED selective air layer transfer print device according to claim 1, wherein the glass substrate part further includes:
   a substrate lift support on which the substrate lift part is formed;

a substrate left-right movement guide part which guides the substrate lift support to move left and right;

a substrate left-right movement support on which the substrate left-right movement guide part is formed; and a substrate front-rear movement part which guides the substrate left-right movement support to move forward and backward.

4. A micro LED selective air layer transfer print device comprising:

a laser light source part which irradiates laser light;

a wafer part which is located under the laser light source part to receive the laser light irradiated from the laser light source part; and a glass substrate part, which is located under the wafer part and onto which micro LED chips of the wafer part are transferred, wherein the glass substrate part includes:

a substrate stage which is located under the wafer part; and a substrate lift part which lifts the whole substrate stage or only a portion of the substrate stage wherein the substrate lift parts are formed in multiple, and each of the substrate lift parts includes:

a first drive part;

a first drive shaft for the first drive part;

a drive slope member moving back and forth according to the rotation of the first drive shaft;

a passive slope member which contacts the drive slope member and is lifted and lowered by the drive slope member; and a lift guide part formed to guide the lifting and lowering of the passive slope member.

5. The micro LED selective air layer transfer print device according to claim 3, further comprising:

a substrate rotation part, which is formed between the bottom of the substrate stage and the top of the substrate lift support to rotate the substrate stage.

6. The micro LED selective air layer transfer print device according to claim 3, further comprising:

a stage support member, which is formed on the substrate lift support to support the bottom of the substrate stage.

7. The micro LED selective air layer transfer print device according to claim 5, wherein the substrate rotation part includes:

a cylindrical rotational center member formed in the center of the substrate lift support;

a cylindrical rotation member formed around the cylindrical rotational center member;

a substrate passive rotation member formed on one side of the substrate stage; and a substrate driving rotation member formed on one side of the top of the substrate lift support to rotate the substrate passive rotation member, wherein when the substrate passive rotation member moves by the substrate driving rotation member, the cylindrical rotation member rotates around the rotating central cylindrical member.

8. The micro LED selective air layer transfer print device according to claim 6, wherein the stage support member includes:

a stage support cylinder part;

a first direction movement support part which is formed on the lower portion of the stage support cylinder part; and a second direction movement support part, which is formed to be movable in a direction perpendicular to the first direction movement support part on the lower part of the first direction movement support part.

* * * * *